United States Patent
Iwamoto et al.

(10) Patent No.: US 7,087,563 B2
(45) Date of Patent: Aug. 8, 2006

(54) RESIST STRIPPING COMPOSITION AND METHOD OF PRODUCING SEMICONDUCTOR DEVICE USING THE SAME

(75) Inventors: Hayato Iwamoto, Kanagawa (JP); Ryuichi Kanamura, Tokyo (JP); Ai Endou, Kanagawa (JP); Tomoko Suzuki, Tokyo (JP); Toshitaka Hiraga, Kanagawa (JP)

(73) Assignees: Sony Corporation, Tokyo (JP); EKC Technology K.K., Kanagawa (JP)

( * ) Notice: Subject to any disclaimer, the term of this patent is extended or adjusted under 35 U.S.C. 154(b) by 191 days.

(21) Appl. No.: 10/467,354

(22) PCT Filed: Dec. 4, 2002

(86) PCT No.: PCT/JP02/12688

§ 371 (c)(1), (2), (4) Date: Aug. 4, 2003

(87) PCT Pub. No.: WO03/048866

PCT Pub. Date: Jun. 12, 2003

(65) Prior Publication Data

US 2004/0081924 A1    Apr. 29, 2004

(30) Foreign Application Priority Data

Dec. 4, 2001 (JP) ............................. 2001-370742

(51) Int. Cl.
*C11D 7/50* (2006.01)
(52) U.S. Cl. .................. 510/175; 510/176; 134/1.3
(58) Field of Classification Search ................. None
See application file for complete search history.

(56) References Cited

U.S. PATENT DOCUMENTS

| 5,962,385 | A | * | 10/1999 | Maruyama et al. | ......... 510/176 |
| 5,968,848 | A | * | 10/1999 | Tanabe et al. | ............. 438/745 |
| 5,972,862 | A | * | 10/1999 | Torii et al. | .................. 510/175 |
| 6,068,000 | A | * | 5/2000 | Tanabe et al. | ............. 134/1.3 |
| 6,372,410 | B1 | * | 4/2002 | Ikemoto et al. | ............. 430/318 |
| 6,500,270 | B1 | * | 12/2002 | Nohara et al. | ................ 134/2 |
| 6,638,899 | B1 | * | 10/2003 | Wakiya et al. | ............. 510/176 |

FOREIGN PATENT DOCUMENTS

| JP | 2000-181083 A | 6/2000 |
| JP | 2001-083713 A | 3/2001 |
| JP | 2001-100436 A | 4/2001 |

* cited by examiner

*Primary Examiner*—Gregory Webb
(74) *Attorney, Agent, or Firm*—Robert J. Depke; Trexler, Bushnell, Giangiorgi, Blackstone & Marr, Ltd.

(57) ABSTRACT

A resist stripping composition capable of reliably stripping off resist residue or polymer residue and keeping damage to the interconnects to a minimum and a method of producing a semiconductor device using the same, where the resist stripping composition comprises a salt of hydrofluoric acid and a base not including a metal, an organic solvent, a sugar alcohol such as xylitol, and water and has a hydrogen ion concentration of at least 8. The method of production of a semiconductor device comprises dry etching a metal layer or a semiconductor layer on a semiconductor substrate to form an interconnect layer having a predetermined pattern or forming an insulation layer on a semiconductor substrate formed with an interconnect layer and dry etching this to a predetermined pattern, then performing chemical treatment using a resist stripping composition comprising a salt of hydrofluoric acid and a base not including a metal, an organic solvent, a sugar alcohol such as xylitol, and water and having a hydrogen ion concentration of at least 8.

11 Claims, 5 Drawing Sheets

RESIST STRIPPING COMPOSITION AND METHOD OF PRODUCING SEMICONDUCTOR DEVICE USING THE SAME

This application claims priority to Japanese Patent Application Number JP2001-370742, filed Dec. 4, 2001, which is incorporated herein by reference.

TECHNICAL FIELD

The present invention relates to a resist stripping composition, more particularly to a resist stripping composition preferably used for production of an IC, LSI, or other semiconductor device and a semiconductor device in a liquid crystal display, able to strip the resist at a low temperature in a short time, having a high safety, and easy to handle. Moreover, the present invention relates to a method of producing a semiconductor device capable of suppressing etching action on aluminum interconnects formed on a semiconductor substrate due to chemical treatment.

BACKGROUND ART

In an IC, LSI, or other semiconductor device and a semiconductor device in a liquid crystal display, aluminum, aluminum alloy, or another conductive metal and $SiO_2$ or other insulating film are formed on a silicon substrate or glass substrate, a photoresist is uniformly coated, then a resist pattern is formed by a photolithographic process, the conductive metal and the insulating film are dry-etched using the pattern as a mask, then the unnecessary resist is stripped off to form the microcircuit.

Recently, along with the increasingly higher integration and densities of integrated circuits, super miniaturization has become demanded. Extensive use is therefore being made of the method of performing sophisticated dry etching, then stripping off the unnecessary resist by plasma ashing. Due to the dry etching and the ashing treatment, resist residue is left at the side walls, bottom, etc. of the patterns. If the resist residue is not completely stripped off, problems occur such as a reduced yield.

As the prior art for stripping off the resist residue, a stripper based on a fluorocompound (see Japanese Unexamined Patent Publication (Kokai) No. 7-201794, Japanese Unexamined Patent Publication (Kokai) No. 8-202052, and Japanese Unexamined Patent Publication (Kokai) No. 11-271985), an amine-based stripper containing hydroxylamine (see U.S. Pat. No. 5,334,332), a stripper based on a quaternary ammonium compound (see Japanese Unexamined Patent Publication (Kokai) No. 7-247498), etc. may be mentioned. However, with these strippers, various defects are observed such as a low removal power of the resist residue weak or corrosiveness with respect to various types of interconnect materials and insulating films. Therefore, a high functional stripper which is able to handle super miniaturization, that is, has a high removal power of the resist residue and will not corrode various types of interconnect materials and insulating films, is being sought. In particular, at the present, the above problem is surfacing in aluminum alloy interconnects.

Aluminum alloy interconnects are generally formed by processing by dry etching using a resist patterned by lithography as a mask. After that, the remaining resist (resist residue) and reaction by-products formed by the dry etching (below, "polymer residue") are removed by a stripper comprised of a chemical.

However, aluminum alloy interconnects made finer along with the increasingly high integration of semiconductor integrated circuits are corroded or etched by such a stripper. Along with this phenomenon, the line resistance is observed to increase. This phenomenon is particularly observed with strippers based on fluorocompounds. Further, such a phenomenon is less frequent with amine-based strippers containing hydroxylamine or strippers based on quaternary ammonium compounds, however, the stripping performance of the resist residue or the polymer residue is insufficient. Moreover, there is a phenomenon where the etching action of other metals (material burying lower layer contact holes such as tungsten) is accelerated causing electrical short-circuits. Under these circumstances, application is difficult.

For example, if measuring the line resistance-yield characteristic for micro aluminum alloy interconnects, specifically dense interconnects of line and space dimensions of 0.22 μm/0.24 μm, it is learned that when using conventional chemicals, it is difficult to suppress the rise of the line resistance and ultimately the desired line resistance-yield characteristic cannot be secured. Of course, if forming interconnects under milder conditions, the extent of rise in the line resistance does not become a problem even in the prior art and consequently a good yield can be secured, but the more the interconnects are miniaturized, the more conspicuous the above problem becomes. Improvement is being awaited.

Further, for example, if measuring the relationship between contact chain resistance and yield by TEG (Test Element Group) in a borderless contact structure where locally dense and long aluminum interconnects and upper aluminum interconnects have a larger area than sparse lower contacts (structure where lower contacts are not covered by upper aluminum interconnects), it has been learned that with the above prior art, the desired rise in the contact chain resistance cannot be secured and in the end the yield cannot be secured.

The phenomenon is due to the post-treatment chemical for removing the resist after processing for forming the aluminum interconnects and the polymer residue produced during that processing. It is due to the "notching" phenomenon on local aluminum interconnects. It is surmised that this is due to the surface of the aluminum interconnects changing to alumina after the processing to form the aluminum interconnects and the post-treatment chemical etching this alumina and further etching the aluminum material itself. These micro "notches" grow to larger "notches" due to the migration of aluminum due to later heat treatment, so promote a drop in the yield in a process forming multilayer interconnects.

DISCLOSURE OF THE INVENTION

The present invention was proposed with the object of eliminating these defects of the prior art. Namely, the present invention has as its object to provide a resist stripping composition capable of reliably removing resist residue or polymer residue produced as a by-product of dry etching and capable of keeping to a minimum damage to the interconnects (corrosion or etching). Further, the present invention has as its object to provide a method of producing a semiconductor device capable of eliminating deterioration of characteristics caused by remainder of resist residue or polymer residue and suppressing a rise of resistance caused by decreased line width of the interconnects.

The inventors conducted various studies so as to achieve the above objects. As a result, they reached the discovery that by adding a sugar alcohol to a stripper based on a fluorocompound, it is possible to suppress damage to the interconnects (corrosion or etching).

The present invention was perfected based on this discovery. Namely, the resist stripping composition of the present invention is characterized by comprising a salt of hydrofluoric acid and a base not containing a metal, an organic solvent, a sugar alcohol, and water and having a hydrogen ion concentration of at least 8. Further, the method of producing a semiconductor device of the present invention is characterized by dry etching a metal film or semiconductor film on a semiconductor substrate to form an interconnect layer having a predetermined pattern or forming an insulation layer on a semiconductor substrate formed with an interconnect layer and processing the insulation layer by dry etching, then chemically treating the surface using a resist stripping composition comprising a salt of hydrofluoric acid and a base not containing a metal, an organic solvent, a sugar alcohol, and water and having a hydrogen ion concentration of at least 8.

For example, to suppress the decrease in line width of aluminum interconnects due to the resist stripping chemical, it is expedient to reduce to zero as much as possible the attack (corrosion or etching action) of the chemical on the aluminum or aluminum alloy interconnects. To realize this, it is sufficient not to etch the layer including alumina formed at the aluminum or aluminum alloy surface.

This etching of the layer including alumina is mainly due to the fluorocompound. In experiments by the inventors, it was learned that by using a composition containing a sugar alcohol, the etching action on alumina is greatly suppressed. Sugar alcohol has the function of an anticorrosive. By using a composition containing a sugar alcohol, the etching rate of alumina at the temperature of use (room temperature) becomes no more than 1.0 nm/min. Therefore, as a result, the decrease in width of interconnects composed of aluminum alloys etc. is prevented and the rise of the line resistance is suppressed.

BEST MODE FOR CARRYING OUT THE INVENTION

Figure 1:
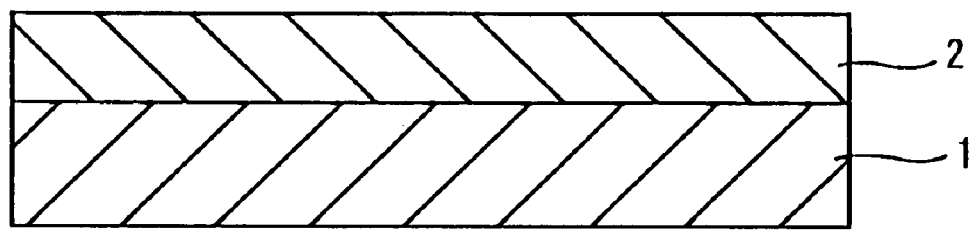
FIG. 1 is a schematic cross-sectional view showing an example of the process for forming interconnects of a semiconductor device in the order of the steps and shows a step of forming a conductive thin film.

Below, a resist stripping composition and a method of producing a semiconductor device applying the present invention will be described in detail with reference to the drawings.

The resist stripping composition of the present invention has as its basic composition a fluorocompound, an organic solvent, and water, has a sugar alcohol added to this, and has a hydrogen ion concentration (pH) adjusted to at least 8. By using this resist stripping composition, the etching rate of alumina can be suppressed to no more than 1.0 nm/min. As a result, the reduction in the line width of interconnects composed of aluminum alloy etc. is prevented and the rise in line resistance can be suppressed.

The fluorocompound used in the resist stripping composition of the present invention is a salt of hydrofluoric acid and a base not containing metal ions. Here, as the base not containing metal ions, hydroxylamines, primary, secondary, and tertiary aliphatic amines, alicyclic amines, heterocyclic amines, and other organic amines, aqueous ammonia, a lower alkyl ammonium base, etc. are preferably used.

As hydroxylamines, specifically hydroxylamine, N,N-diethylhydroxylamine, etc. may be mentioned. As primary aliphatic amines, monoethanolamine, isopropanolamine, 2-(2-aminoethylamino)ethanol, ethylenediamine, monomethylamine, monoethylamine, etc. may be mentioned. As secondary aliphatic amines, diethanolamine, diisopropanolamine, N-methylethanolamine, N-ethylethanolamine, dimethylamine, diethylamine, etc. may be mentioned. As tertiary aliphatic amines, N,N-dimethylethanolamine, N,N-diethylethanolamine, methyldiethanolamine, ethyldiethanolamine, trimethylamine, triethylamine, etc. may be mentioned.

As alicyclic amines, cyclohexylamine, dicyclohexylamine, etc. may be mentioned. As heterocyclic amines, pyrrole, pyrrolidine, pyrrolidone, morpholine, pyrazine, piperidine, oxazole, thiazole, etc. may be mentioned. As lower alkyl quaternary ammonium bases, tetramethylammonium hydroxide, (2-hydroxyethyl)trimethylammonium hydroxide, etc. may be mentioned.

Among these, aqueous ammonia is most preferably used from the points of being easy to obtain and superior in safety etc. The concentration of the fluorocompound is preferably set in a range of 0.001 to 1.0 wt %. If the concentration of the fluorocompound is less than 0.001 wt %, the removability of the resist residue falls, while if over 1.0 wt %, corrosion of the interconnect material becomes greater, so these are not desirable.

As the organic solvent, it is possible to use any which can dissolve the other ingredients. Particularly, a mixed solvent of an amide-based solvent and a glycol ether-based solvent is preferably used. Here, as the amide-based solvent, N,N-dimethylformamide, N,N-dimethylacetamide, N-methyl-2-pyrrolidone, etc. are preferable. As the glycol ether-based solvent, diethylene glycol monomethyl ether, diethylene glycol monobutyl ether, dipropylene glycol monomethyl ether, etc. are preferable. The mixture ratio of the amide-based solvent and glycol ether-based solvent may be any ratio. Further, the content of the organic solvent as a whole is preferably made 30 to 98 wt %. If the content of the organic solvent is less than 30 wt %, corrosion of the interconnect material, insulating film, etc. becomes greater, while if over 98 wt %, the removablity of resist residue falls, so these are not desirable.

As the sugar alcohol functioning as the anticorrosive, treitol, erythritol, adonitol, xylitol, talitol, iditol, dulcitol, etc. can be used. In particular, the effect of xylitol is high. The concentration of the sugar alcohol is preferably made 0.01 to 10 wt %. If less than 0.01 wt %, the anticorrosive effect on the interconnect material, insulating film, etc. falls, while if over 10 wt %, the removablity of the resist residue falls. Further, the hydrogen ion concentration (pH) in to the resist stripping composition of the present invention has to be at least 8. If the pH of the resist stripping composition is less than 8, removablity of the resist residue would again fall, so this is not desirable.

The resist stripping composition having the above composition can be applied to a method of production of a semiconductor device formed with interconnects. Due to this, highly integrated circuits can be produced easily. Further, in treatment using a conventional stripper, after performing the treatment for cleaning off the resist residue, corrosion occurred on the aluminum surface of the aluminum interconnects, so it was not possible to allow the treated wafer to stand in the air for a long time. By treating the surface with the resist stripping composition of the present invention, occurrence of corrosion after cleaning can be reduced. Therefore, it was learned that the treated wafer can be allowed to stand for a long time and excellent operatability is obtained. Below, the process of production of a semiconductor device utilizing the present invention will be described.

When forming interconnects at a semiconductor device, first, as shown in FIG. 1, a conductive thin film 2 is formed on a base substrate 1. As the inorganic substrate used as the base substrate 1, silicon, amorphous silicon, polycrystalline silicon, a silicon oxide film, a silicon nitride film, copper and copper alloys, aluminum, aluminum alloys, titanium, titanium-tungsten, titanium nitride, tungsten, tantalum, tantalum compounds, chromium, chromium oxide, chromium alloys, ITO (indium-tin oxide), and other semiconductor interconnect materials, gallium-arsenic, gallium-phosphorus, indium-phosphorus, and other compound semiconductors, a glass substrate in an LCD, etc. may be mentioned.

As the conductive thin film 2, a metal film, a semiconductor film, etc. is used. The present invention is particularly preferably used when the conductive thin film 2 is aluminum or an aluminum alloy (aluminum-copper, aluminum-silicon, etc.). Further, the conductive thin film 2 may be a single layer film or may be a multilayer film. For example, a Ti layer or TiN layer for improvement of contact may be stacked above an aluminum alloy film.

Figure 2:
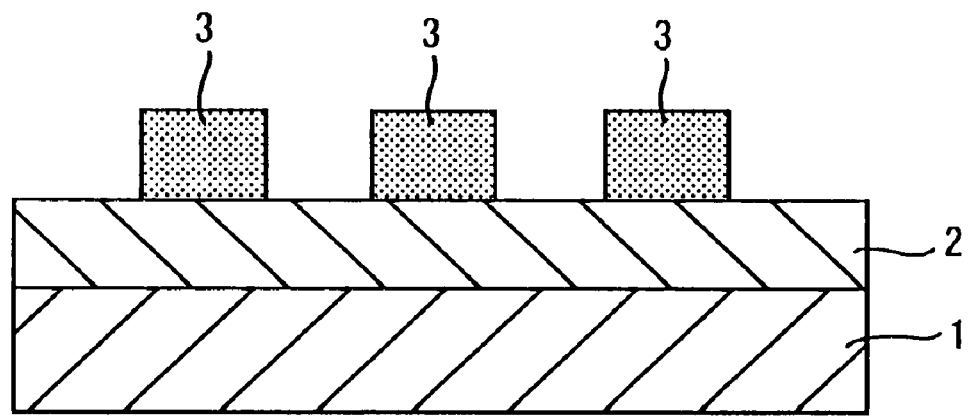
FIG. 2 is a schematic cross-sectional view showing a step of forming a resist pattern.
Figure 3:
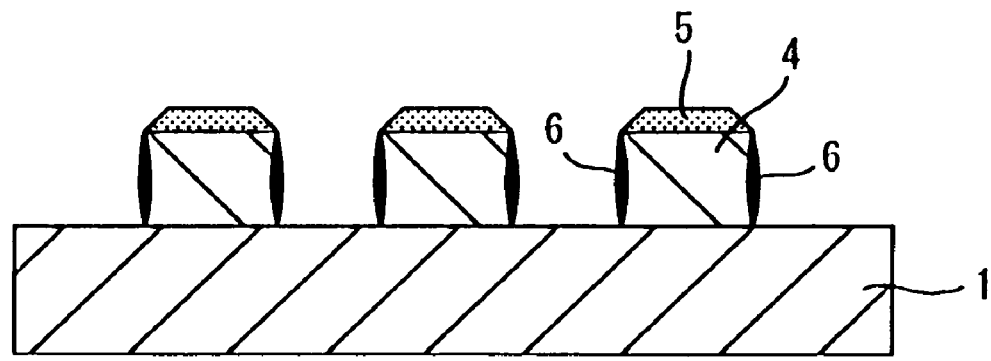
FIG. 3 is a schematic cross-sectional view showing a step of patterning an interconnect layer by dry etching.

Next, the conductive thin film 2 is patterned by dry etching to form an interconnect layer having a predetermined pattern. In the dry etching, as shown in FIG. 2, a resist pattern 3 is formed. This is used as a mask for dry etching to form the interconnect layer 4 as shown in FIG. 3. After the dry etching, resist residue 5 remains on the interconnect layer 4, and polymer residue 6 produced as a by-product adheres to the side walls of the interconnect layer 4.

Figure 4:
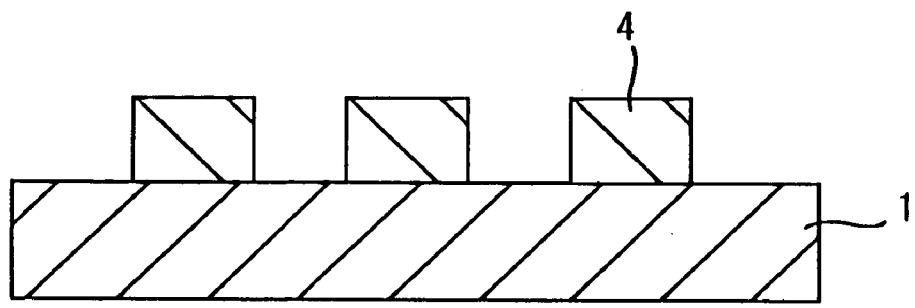
FIG. 4 is a schematic cross-sectional view showing a state after chemical treatment.

Therefore, chemical treatment is performed using a resist stripping composition having the above composition to strip off the resist residue 5 or polymer residue 6 as shown in FIG. 4. The temperature when performing the chemical treatment using the resist stripping composition of the present invention, is generally in the range of ordinary temperature to 90° C. However, it is possible to strip the residue even at a low temperature of 30° C. or less, so it is desirable to strip the residue at as low a temperature as possible considering the attack on the material (interconnect layer 4).

Note that after the dry etching, ashing may be performed if desired. Suitably thereafter, the residue caused by the dry etching may be removed by the above resist stripping composition. The "ashing" referred to here means treating a resist comprised of for example an organic polymer by oxygen plasma produced in plasma and removing it as CO and $CO_2$ by a combustion reaction. It is also possible to jointly perform treatment by a rinse agent before or after the chemical treatment.

Figure 5:
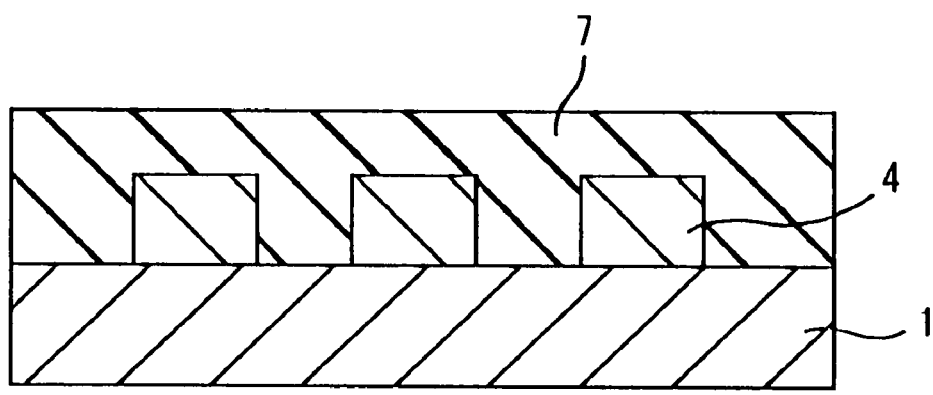
FIG. 5 is a schematic cross-sectional view showing a step of forming an interlayer insulating film.

After finishing above the chemical treatment, as shown in FIG. 5, an interlayer insulating film 7 is formed to protect the interconnect layer 4 and insulate it from a later formed interconnect layer. The interlayer insulating film 7 is also dry etched to form for example contact holes for interlayer connection. The chemical treatment using the above resist stripping composition is effective even after the dry etching of the interlayer insulating film 7.

Figure 6:
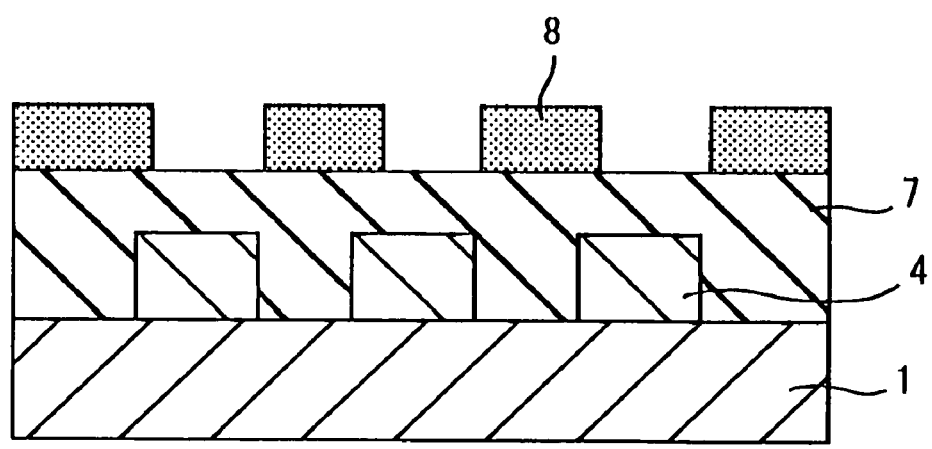
FIG. 6 is a schematic cross-sectional view showing a step of forming a resist pattern.
Figure 7:
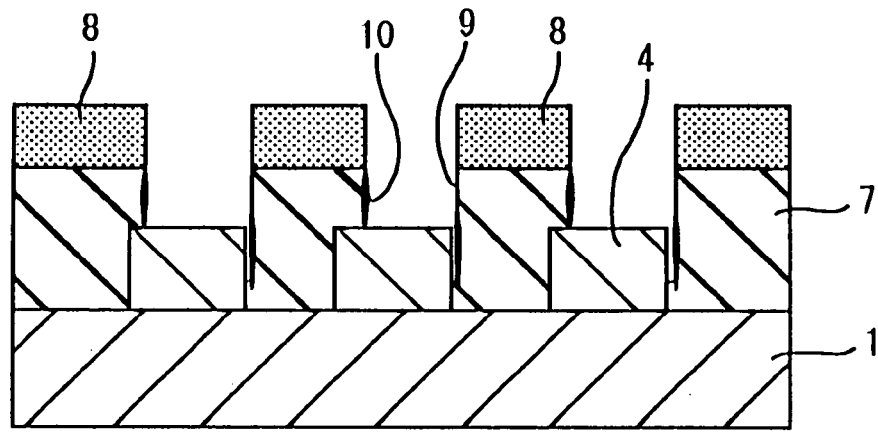
FIG. 7 is a schematic cross-sectional view showing a step of forming contact holes.

The contact holes are formed in the interlayer insulating film 7, as shown in FIG. 6, by forming a resist pattern 8 on the interlayer insulating film 7 and using this as a mask for dry etching. Due to this, as shown in FIG. 7, contact holes 9 are formed in the interlayer insulating film 7. Simultaneously with this, polymer residue 10 produced as a by-product of etching adheres at the side walls of the contact holes 9. If the polymer residue 10 remains as it is, it will become a cause of deterioration of the characteristics in for example interlayer connection. Therefore, after the dry etching, chemical treatment is performed using the above resist stripping composition to srip off the polymer residue 10. The interconnect layer 4 is partially exposed in the contact holes 9, but is not corroded or etched by the above resist stripping composition, so the resistance does not increase by this cleaning.

Figure 8:
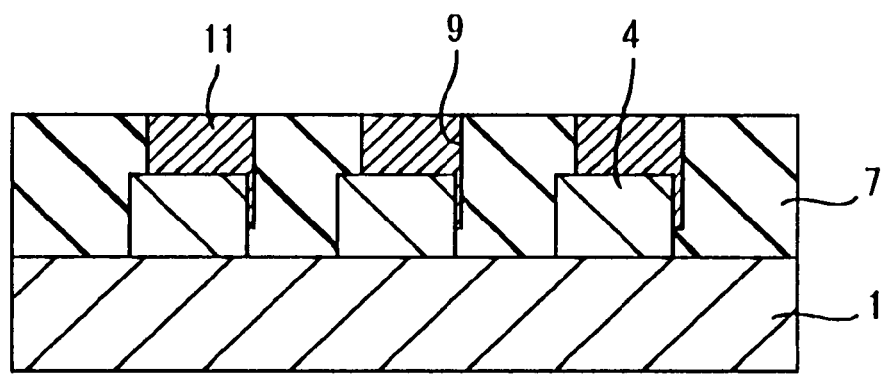
FIG. 8 is a schematic cross-sectional view showing a step of forming metal vias.
Figure 9:
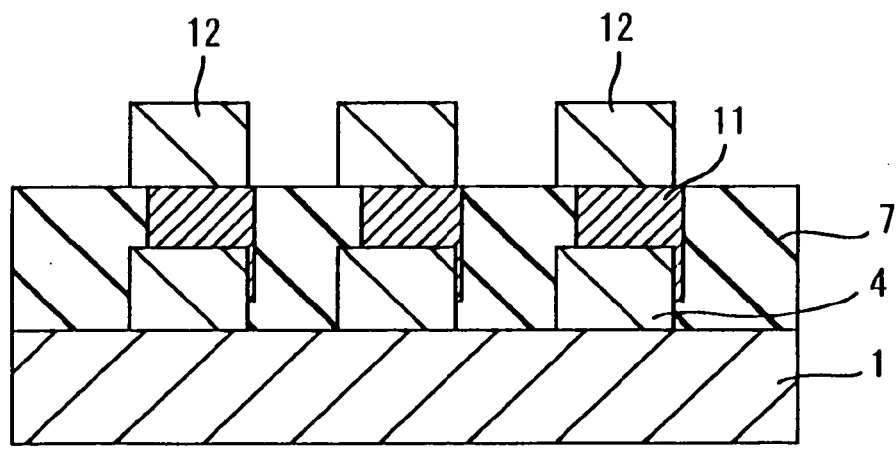
FIG. 9 is a schematic cross-sectional view showing a step of forming a second interconnect layer.

After the chemical treatment, as shown in FIG. 8, a metal or other conductive material is filled in the contact holes 9 to form metal vias 11. As shown in FIG. 9, a second interconnect layer 12 is formed on this. As a result, the interconnect layer 4 and the second interconnect layer 12 are electrically connected via the metal vias 11.

EXAMPLES

Below, specific examples of application of the present invention will be described based on results of experiments.

Example 1

In the present example, metal interconnects were formed on a base substrate formed in advance with transistors and other devices and the cleaning effect was confirmed. The process of production up to the formation of the first interconnect layer is as follows (see FIG. 1 to FIG. 4).

Formation of metal interconnect film->dry etching->resist ashing->chemical treatment->pure water rinsing->drying The metal interconnect film was made the following five-layer film and was formed by magnetron sputtering.

Ti 20 nm (0.52 Pa, 2 kW, Ar 35 sccm, 300° C.)

TiN 20 nm (0.78 Pa, 6 kW, $N_2$ 42 sccm, Ar 21 sccm, 300° C.)

Al-0.5% Cu 500 nm (0.52 Pa, 15 kW, Ar 65 sccm, 300° C.)

Ti 5 nm (0.52 Pa, 2 kW, Ar 35 sccm, 300° C.)

TiN 100 nm (0.78 Pa, 6 kW, $N_2$ 42 sccm, Ar 21 sccm, 300° C.)

The dry etching is a step of processing the metal interconnect film to a predetermined pattern. We formed a resist pattern by photolithography and used this as a mask for processing under the following conditions.

Dry etching conditions:
$BCl_3/Cl_2$=100/150 sccm, 1 Pa, microwave
400 mA, RF 110W, just +40% over etching The shape after processing became that as shown in FIG. 3. We removed the remaining portion of the resist pattern by ashing. The ashing conditions were as follows:

Resist ashing:
Parallel plate RIE apparatus
$O_2$=3250 sccm, 250° C., 150 Pa, 900W, 60 sec Further, we removed the slightly remaining resist and the polymer residue adhering at the metal interconnects due to the dry etching of the metal interconnects by the following chemical treatment.

Resist stripping composition:
Ammonium fluoride 0.15 wt %
N,N-dimethylacetamide 55.0 wt %
Diethylene glycol monomethyl ether 32.0 wt %
Xylitol 1.0 wt %
Balance water, pH 9.0
Chemical treatment time: 180 sec By applying the resist stripping composition of the present invention, the shape after the above treatment became as shown in FIG. 4. That is, it was possible to realize a shape free of residual parts of the resist pattern, cleanly stripped of the polymer residue as well, free of almost all etching of the alumina present on the surface of the metal interconnects, and free of almost any reduction in line width.

Next, we formed an interlayer insulating film on the metal interconnects (see FIG. 5) so as to complete one interconnect layer.

Conditions for forming interlayer insulating film:
HDP-$SiO_2$ CDV 380° C., 3250 W,
$SiH_4/O_2$/Ar=60/110/200 SCCM,
3 mTorr, 1400 nm Conditions for flattening interlayer film:
$SiO_2$ CMP 500 nm polishing Next, we formed a resist pattern on the interlayer insulating film by photolithography so as to provide vias with the upper metal interconnects (see FIG. 6). Then, we formed contact holes by dry etching under the following conditions:

Dry etching conditions:
$C_4F_8$/Ar/CO/$O_2$=20/400/50/13 sccm, 35 mTorr,
RF 2200W
just +15% over etching The shape after processing became as shown in FIG. 7. We removed the remaining part of the resist pattern by ashing. Further, we removed the polymer residue adhering to the inside walls of the contact holes due to the dry etching process by chemical treatment.

Resist ashing:
Parallel plate RIE apparatus
$O_2$=3250 sccm, 250° C., 150 Pa, 900W, 60 sec The process of the chemical treatment is as follows:
Chemical treatment (900 sec)->alcohol rinsing->pure water rinsing->drying The chemical treatment used an organic stripper containing an amine. From the viewpoint of stripping the resist and polymer residues, the chemical used here is preferably for example a solution of alkanol amine, hydroxylamine, catechol, and water rather than the resist stripping composition of the present invention. Of course, there is no problem even if using the resist stripping composition according to the present invention. Further, for the alcohol rinsing, isopropyl alcohol, N-methyl-2-pyrrolidone, etc. is preferably used.

Next, we buried the contact holes by for example a tungsten film, then formed metal vias (W plugs) by CMP etc.

Conditions for forming W plugs:
Reverse sputtering, corresponding to 20 nm of thermal oxidation film
Directional sputtering TiN 30 nm
W CVD formation, 300 nm, 400° C., 10.7 kPa,
$WF_6/H_2$/Ar=40/400/2250 sccm Condition for processing W plugs:
W-CMP 300 nm polishing+TiN-CMP 30 nm polishing Next, it is possible to form an upper metal interconnect layer so as to form a multilayer metal interconnect structure (see FIG. 8 and FIG. 9). The process flow and conditions of formation are similar to those of FIG. 2 to FIG. 4. It is therefore possible to suppress a rise in the electric characteristics and line resistance of the metal interconnects formed in this way and achieve a high yield.

Figure 10:
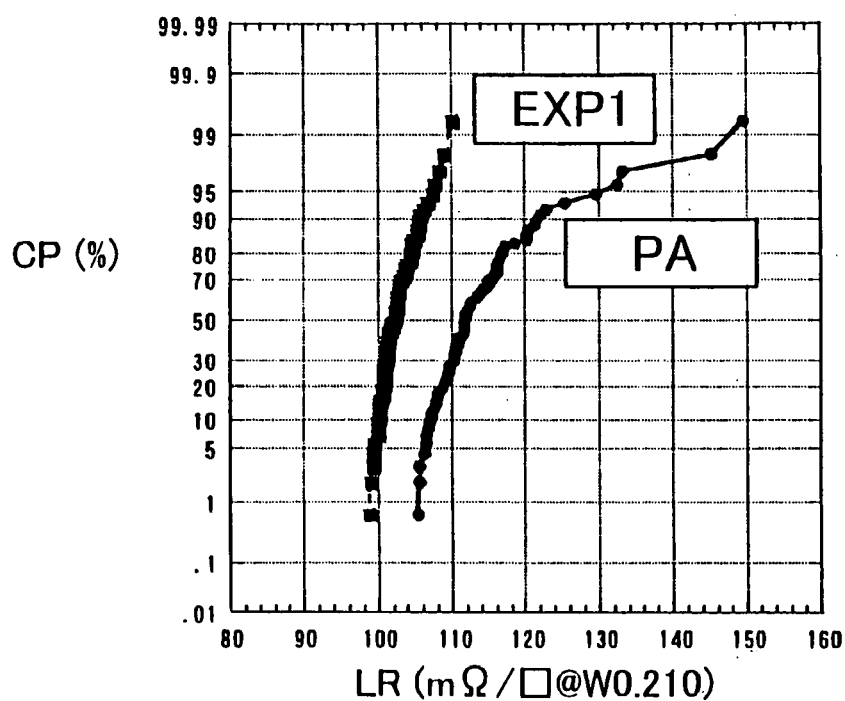
FIG. 10 is a graph showing a relation between line resistance and yield in a first example compared with the prior art.

We measured the line resistance-yield characteristic is a semiconductor device produced as explained above. FIG. 10 is a graph showing the relation between the line resistance and yield in Example 1 (EXP 1) compared with the prior art (PA). The ordinate is the cumulative probability (CP), and the abscissa is the line resistance (LR). We measured this by a dense interconnect TEG of a line and space of 0.22 μm/0.24 μm. As shown, it became possible to suppress the rise in line resistance compared with the prior art. As a result, it was learned that the desired line resistance-yield characteristic can be secured well.

Figure 11:
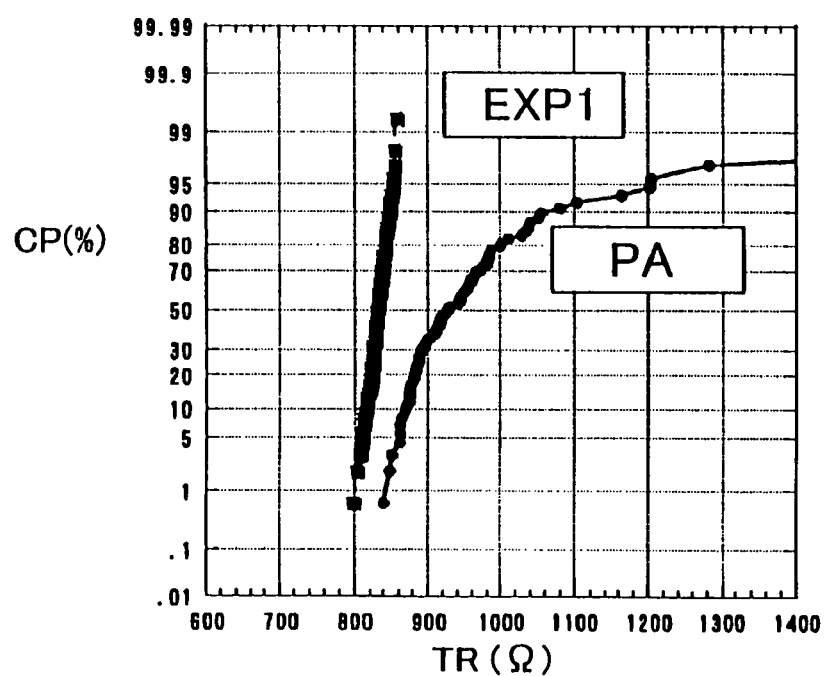
FIG. 11 is a graph showing a relation between contact chain resistance and yield in a first example compared with the prior art.

Further, we measured the relation between contact chain resistance and yield by TEG in a borderless contact structure where locally dense and long aluminum interconnects and upper aluminum interconnects have a larger area than sparse lower contacts (structure where lower contacts are not covered by upper aluminum interconnects). FIG. 11 is a graph showing the relation between contact chain resistance and yield in Example 1 (EXP1) compared with the prior art (PA). The ordinate is the cumulative probability (CP), while the abscissa is the TEG resistance (TR).

It was learned that, compared with the prior art, it is possible to suppress the contact chain resistance value and as a result a good yield can be secured. This is due to the fact that the local "notching" phenomenon on aluminum interconnects due to the post-treatment chemical for removing the resist after processing the aluminum interconnects and the polymer residue formed during processing was suppressed.

Example 2

The composition of the resist stripping composition was changed as follows. Otherwise, the same procedure was followed as in Example 1 to produce a semiconductor device.

Resist stripping composition:
Ammonium fluoride 0.05 wt %
N,N-dimethylacetamide 40.0 wt %
Diethylene glycol mono-n-butyl ether 51.0 wt %
Xylitol 1.0 wt %
Balance water, pH 8.7

Figure 12:
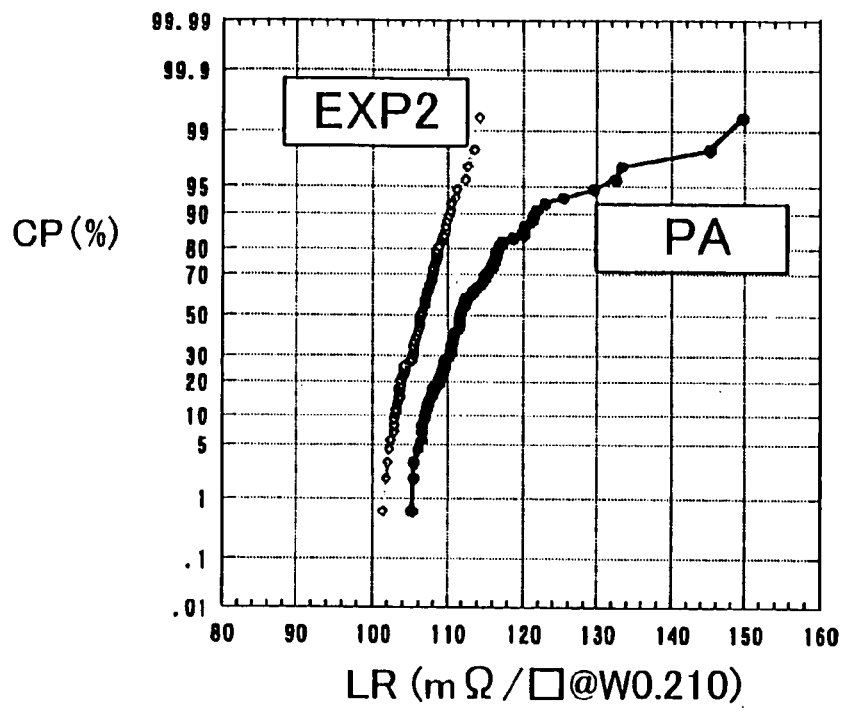
FIG. 12 is a graph showing a relation between line resistance and yield according to a second example compared with the prior art.

We measured the line resistance-yield characteristic of the metal interconnects in the semiconductor device produced as explained above. FIG. 12 is a graph showing the relation between line resistance and yield in Example 2 (EXP2) compared with the prior art (PA). The ordinate is the cumulative probability (CP), while the abscissa is the line resistance (LR). We measured the characteristic by dense interconnect TEG of a line and space of 0.22 μm/0.24 μm. As illustrated, it became possible to suppress a rise in the line resistance compared with the prior art. As a result, it was learned that the desired line resistance-yield characteristic can be secured well.

Figure 13:
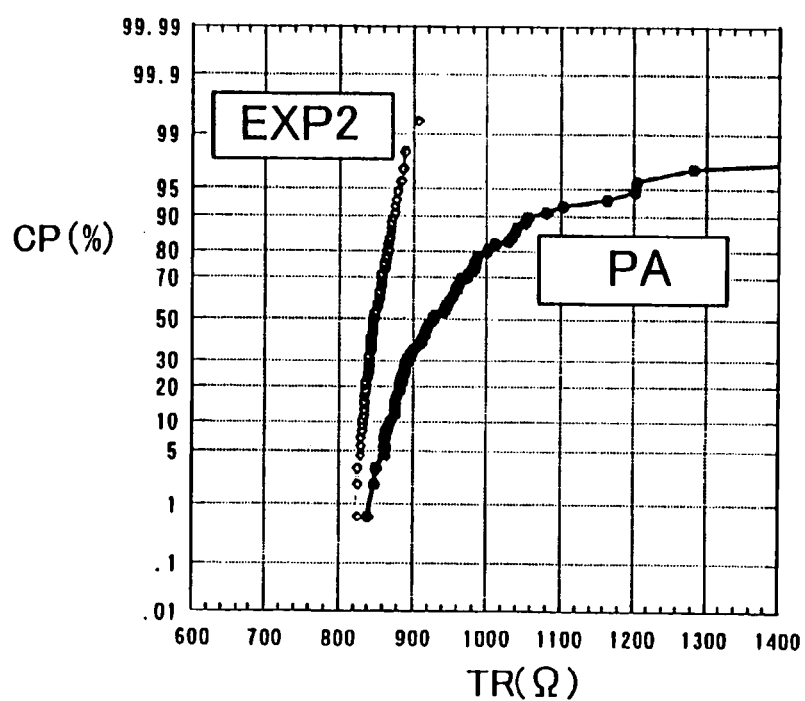
FIG. 13 is a graph showing a relation between contact chain resistance and yield according to a second example.

Further, we measured the relation between contact chain resistance and yield by TEG in a borderless contact structure where locally dense and long aluminum interconnects and upper aluminum interconnects have a larger area than sparse lower contacts (structure where lower contacts are not covered by upper aluminum interconnects). FIG. 13 is a graph showing the relation between contact chain resistance and yield in Example 2 (EXP2) compared with the prior art (PA). The ordinate is the cumulative probability (CP), while the abscissa is the TEG resistance (TR).

It was learned that, compared with the prior art, it is possible to suppress the contact chain resistance value and as a result a good yield can be secured. This is due to the fact that the local "notching" phenomenon on aluminum interconnects due to the post-treatment chemical for removing the resist after processing the aluminum interconnects and the polymer residue formed during processing was suppressed.

As clear from the above description, by using the present invention, it becomes possible to suppress a rise in the line resistance after processing the metal interconnects and production of a semiconductor device becomes possible without causing deterioration of the yield or reliability of the semiconductor device. Further, according to the present invention, the resist residue and polymer residue can be reliably stripped off and deterioration of the characteristics of the semiconductor device can be reliably avoided.

INDUSTRIAL APPLICABILITY

The resist stripping composition of the present invention can be applied to the step of stripping off resist residue or a polymer residue at a low temperature in a short time in the production of a semiconductor device.

The method of producing a semiconductor device of the present invention can be applied to production of an IC, LSI, or other semiconductor device or a semiconductor device in a liquid crystal display.

The invention claimed is:

1. A resist stripping composition characterized by comprising 0.001 to 1.0 wt % of a salt of hydrofluoric acid and a base not containing a metal, 30 to 98 wt % of an organic solvent, 0.01 to 10 wt % a sugar alcohol, and the balance being water and having a hydrogen ion concentration of not less than 8.

2. A resist stripping composition as set forth in claim 1, wherein said salt of hydrofluoric acid and a base not containing a metal is ammonium fluoride.

3. A resist stripping composition as set forth in claim 1, wherein said organic solvent is a mixed solvent of an amide-based solvent and a glycol ether-based solvent.

4. A resist stripping composition as set forth in claim 3, wherein said amide-based solvent is at least one type selected from N,N-dimethylformamide, N,N-dimethylacetamide, and N-methyl-2-pyrrolidone and said glycol ether-based solvent is at least one type selected from diethylene glycol monomethyl ether, diethylene glycol monobutyl ether, and dipropylene glycol monomethyl ether.

5. A resist stripping composition as set forth in claim 1, wherein said sugar alcohol is xylitol.

6. A method of production of a semiconductor device characterized by:
dry-etching a metal film or a semiconductor film on a semiconductor substrate to form an interconnect layer having a predetermined pattern and
performing chemical treatment using a resist stripping composition comprising 0.001 to 1.0 wt % of a salt of hydrofluoric acid and a base not containing a metal, 30 to 98 wt % of an organic solvent, 0.01 to 10 wt % a sugar alcohol, and the balance being water and having a hydrogen ion concentration not less than 8.

7. A method of production of a semiconductor device as set forth in claim 6, wherein said metal film is an aluminum film or aluminum alloy film.

8. A method of production of a semiconductor device as set forth in claim 6, comprising, said dry etching, performing ashing and then said chemical treatment.

9. A method of production of a semiconductor device characterized by:
forming an insulation layer on a semiconductor substrate formed with an interconnect layer and processing said insulation layer by dry etching, then
performing chemical treatment using a resist stripping composition comprising 0.001 to 1.0 wt % of a salt of hydrofluoric acid and a base not a containing metal, 30 to 98 wt % of an organic solvent, 0.01 to 10 wt % a sugar alcohol, and the balance being water and having a hydrogen ion concentration not less than 8.

10. A resist stripping composition characterized by comprising a salt of hydrofluoric acid and a base not containing a metal, an organic solvent, and xylitol, comprising water as the balance and having a hydrogen ion concentration of not less than 8.

11. A resist stripping composition as set forth in claim 1, wherein said salt of hydrofluoric acid is from slightly above 0.5 to 1.0 wt %.

* * * * *